United States Patent [19]

Zertani et al.

[11] Patent Number: 5,114,832
[45] Date of Patent: May 19, 1992

[54] PHOTOPOLYMERIZABLE MIXTURE AND RECORDING MATERIAL PREPARED THEREFROM, HAVING A PHOTOINITIATING SET OF COMPOUNDS WHICH GIVE INCREASED ABSORPTION BELOW 450 NM

[75] Inventors: Rudolf Zertani, Mainz-Bretzenheim; Dieter Mohr, Budenheim; Klaus Rode, Suzano-SP; Werner Frass, Wiesbaden-Naurod; Klaus Joerg, Ingelheim, all of Fed. Rep. of Germany

[73] Assignee: Hoechst Aktiengesellschaft, Frankfurt am Main, Fed. Rep. of Germany

[21] Appl. No.: 406,424

[22] Filed: Sep. 11, 1989

[30] Foreign Application Priority Data

Sep. 10, 1988 [DE] Fed. Rep. of Germany ....... 3830914

[51] Int. Cl.⁵ .................... G03F 7/031; G03F 7/033
[52] U.S. Cl. .................... 430/285; 430/281; 430/288; 430/916; 430/920; 430/926
[58] Field of Search ............ 430/281, 287, 288, 915, 430/293, 285, 926, 916, 920

[56] References Cited

U.S. PATENT DOCUMENTS

| | | | |
|---|---|---|---|
| 3,060,024 | 10/1962 | Burg et al. | 96/28 |
| 3,060,025 | 10/1962 | Burg et al. | 96/28 |
| 3,218,167 | 11/1965 | Burg et al. | 96/85 |
| 3,353,955 | 11/1967 | Colgrove | 96/28 |
| 3,498,791 | 3/1970 | Raubut et al. | 96/91 |
| 3,620,726 | 11/1971 | Fu-Hua Chu et al. | 96/27 R |
| 4,555,474 | 11/1985 | Kawamura et al. | 430/281 |
| 4,563,413 | 1/1986 | Messer | 430/915 |
| 4,661,434 | 4/1987 | Iwasaka et al. | 430/288 |
| 4,666,824 | 5/1987 | Messer | 430/915 |
| 4,701,399 | 10/1987 | Nagano et al. | 430/191 |
| 4,772,534 | 9/1988 | Kawamura et al. | 430/281 |
| 4,810,618 | 3/1989 | Koike et al. | 430/915 |
| 4,877,715 | 10/1989 | Koch et al. | 430/288 |
| 4,894,315 | 1/1990 | Feinberg et al. | 430/288 |
| 4,985,562 | 1/1991 | Rossman et al. | 430/288 |
| 4,987,053 | 1/1991 | Gersdorf et al. | 430/288 |

FOREIGN PATENT DOCUMENTS

| | | |
|---|---|---|
| 3339228A1 | 5/1984 | Fed. Rep. of Germany . |
| 62-161868 | 7/1987 | Japan . |
| 62-231245 | 10/1987 | Japan . |
| 1180438 | 2/1970 | United Kingdom . |

Primary Examiner—Charles L. Bowers, Jr.
Assistant Examiner—John S. Chu
Attorney, Agent, or Firm—Foley & Lardner

[57] ABSTRACT

A photopolymerizable mixture is described, which contains a polymeric binder; an acrylate or alkacrylate of a polyhydric alcohol possessing at least one photooxidizable group; a compound or a combination of compounds being capable of initiating the polymerization of the ester under the action of light in the spectral region of 450 nm to 650 nm; and at least one compound which absorbs light in the region below 450 nm or which upon exposure forms a compound absorbing light in said region, whereby the optical density of the exposed mixture in this region is at least 2.0 at a layer thickness of 2 μm. The mixture is useful for the production of masters or intermediate masters for reprographic layers being sensitive to light in the UV region, exposure of the mixture itself being performed with visible light.

15 Claims, No Drawings

PHOTOPOLYMERIZABLE MIXTURE AND RECORDING MATERIAL PREPARED THEREFROM, HAVING A PHOTOINITIATING SET OF COMPOUNDS WHICH GIVE INCREASED ABSORPTION BELOW 450 NM

BACKGROUND OF THE INVENTION

The present invention relates to a photopolymerizable mixture comprising a polymeric binder, an acrylate or alkacrylate of a polyhydric alcohol, and a photoinitiator or a photoinitiator combination, and to a corresponding recording material comprising a layer support and a photopolymerizable layer of the mixture.

Mixtures and materials of this type are used, for example, for producing printing plates and photoresists. The known mixtures are generally photosensitive in the near UV region; their photosensitivity is, however, substantially reduced by the addition of light-absorbing substances which are, for example, required for the production of intermediate masters or color proofing films.

The masters employed in reprography in most cases are based on silver halide materials which have the disadvantage of being very expensive. Therefore, photosensitive diazotype materials, which upon development give yellow or black azo dyes, are used for duplicating silver halide originals, such as microfilms. A diazotype material of this kind additionally containing a UV absorber has been disclosed in DE-B 1,286,897. Employing this process, only a limited image contrast can be achieved; moreover, films based on diazotype materials have a tendency to background discoloring.

DE-A 15 72 085 describes a photosensitive material for duplicating silver images, containing a photosensitive layer comprising o-quinonediazides and color pigments having an optical density above 1. The photosensitivity of this material, which absorbs in the same spectral region where it is photosensitive, is inadequate for practical use.

U.S. Pat. No. 3,218,167 discloses a photopolymerizable recording material, the photosensitive layer of which is strongly colored by the addition of a dye. The dye used is to absorb as little light as possible in the activating range of the photoinitiator. The material gives images exhibiting a good visual contrast, but these images are not suited as masters.

U.S. Pat. No. 3,353,955 relates to a similar photopolymerizable material that can be developed to give an image as a result of the different adhesion to the support film of the exposed and unexposed layer portions (peel-apart process). The material has a layer which is highly light-absorbing in the actinic spectral region. Due to the considerably reduced photosensitivity, only the upper portions of the photosensitive layer are completely polymerized, whereas the imagewise differentiation in the lower layer portions is low and insufficient for wash-out development. The peel-apart development gives images of relatively low resolution.

It is also known to obtain images of high light absorption from photopolymerizable materials by exploiting the different tackiness of exposed and unexposed areas and developing the exposed materials with a toner powder, optionally at elevated temperatures. The process is described in U.S. Pat. No(s). 3,060,024, 3,060,025 and 3,620,726. The images produced in this way are likewise resolved to a limited degree only.

Color proofing films are also produced and processed employing processes as described above. In most cases, a true rendering of the colors of the original can only be achieved by wash-out development, employing layers which are thoroughly dyed in the desired color. Here, too, at least the photosensitivity of colors absorbing in the shorter-wave region of the spectrum is considerably reduced.

German patent applications P 37 10 279.6, P 37 10 281.8 and P 37 10 282.6 disclose photo-polymerizable mixtures comprising polymeric binders, polymerizable acrylates or alkacrylates possessing photooxidizable groups, and photoinitiators or photoinitiator combinations, in particular photoreducible dyes and optionally certain photosensitive trichloromethyl compounds, as well as optional further free-radical-forming coinitiators. These mixtures are distinguished by a high photospeed, particularly in the longer-wave region of visible light, i.e., above 450 nm. The applications do not mention an addition of strongly light-absorbing substances, in particular UV absorbers, to the mixtures described therein.

SUMMARY OF THE INVENTION

It is therefore an object of the present invention to provide a photopolymerizable mixture and recording material from which images of high absorption in the actinic spectral region below 450 nm can be obtained by wash-out development, and which nevertheless display high photosensitivity during exposure.

In accordance with these and other objects according to the invention, a photopolymerizable mixture is provided, comprising:
(a) a polymeric binder,
(b) an acrylate or alkacrylate of a polyhydric alcohol possessing at least one photooxidizable group,
(c) a compound or a combination of compounds capable of initiating the polymerization of compound (b), under the action of light in the spectral region of 450 to 650 nm, and
(d) at least one compound that absorbs light in the region below 450 nm or that forms a compound that absorbs light in the region below 450 nm upon exposure, whereby the optical density of the exposed mixture below 450 nm is at least about 2.0 at a layer thickness of 2 $\mu$m.

According to the invention, a photo-polymerizable recording material is also provided, comprising a layer support and a photopolymerizable layer of a mixture having the composition specified above.

In accordance with the invention, there is also provided a process for producing copies employing the recording material described above, which process comprises the steps of imagewise exposing the photopolymerizable layer to light of a wavelength above 450 nm, washing out the non-image areas with a developer, and using the resulting negative as a master for the exposure of a photosensitive layer to light in the spectral region below 450 nm.

According to another embodiment of the process of this invention, a color proofing method for multicolor printing is provided comprising the steps of:
(a) providing a recording material as described above, said recording material comprising a transparent, preferably flexible, temporary layer support, which on its rear surface carries an additional photosensitive layer being sensitive to light in the spectral region below 450 nm, containing a dye or pigment having one of the basic colors of the multicolor print, and being transferable from the temporary support to a final receiving sheet;

(b) imagewise exposing the photopolymerizable layer of the recording material using light of a wavelength above 450 nm;

(c) laminating the recording material to a receiving sheet, either before or after the exposure step;

(d) washing out unexposed portions of the photopolymerizable layer;

(e) exposing the additional photosensitive layer through the transparent layer support with the developed photopolymerizable layer serving as master, using light of a wavelength below 450 nm;

(f) peeling the layer support, together with the developed photopolymerizable layer from the additional photosensitive layer;

(g) developing the additional photosensitive layer by washing out the non-image areas, and (h) repeating steps (a) to (g) with at least one further photosensitive recording material whose additional photosensitive layer is dyed with another basic color.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

The recording material of this invention can be present in various embodiments.

It is possible to apply the photo-polymerizable mixture to a transparent support and to use it in the production of masters for materials that are sensitive in the spectral region below 450 nm.

The mixture of this invention can also be applied, as an additional photosensitive layer, to a material carrying a UV-sensitive layer. The photopolymerizable layer having the composition as claimed in this invention is exposed using visible light of wavelengths above about 450 nm, particularly of about 450 to 650 nm, and subsequently developed. The developed layer in imagewise configuration serves as an exposure stencil for the subsequent exposure of UV-sensitive layer, which is performed without an original using light of wavelengths of less than about 450 nm. When the layer support is impermeable to light, the layer comprising the mixture in accordance with this invention must be applied onto the first photosensitive layer. When a transparent layer support is employed, the mixture according to this invention can also be applied to the back side of the support. In this case it is possible to transfer the UV-sensitive layer before or after development to a permanent support by lamination. In this way, a multicolor proof can be built up on the permanent support in several steps in the course of a color proofing procedure.

The layers prepared from the photo-polymerizable mixture of this invention in general have thicknesses of about 0.5 to 10 μm, preferably of about 1 to 6 μm. The optical density of a 2 μm thick layer should be at least about 2; for thinner layers, the concentration of UV-absorbing compound has to be increased such that the optical density of the respective layer is at least about 2. The layers are distinguished by high photosensitivity in the visible spectral region, in particular from about 450 to 650 nm, and they require an energy of not more than about 10 m/cm² complete hardening within this range.

Components a), b) and c) of the mixtures according to this invention are described in detail in the German applications cited above and also in German patent applications Nos. P 37 38 864.9 and P 38 24 903.0.

Polymerizable compounds (b) suitable for the purposes of the invention are acrylic and alkacrylic acid esters of monohydric or polyhydric alcohols, which contain at least one photooxidizable group and optionally at least one urethane group in the molecule.

Suitable photooxidizable groups are, in particular, amino groups, urea groups, thio groups, which may also be the constituents of heterocyclic rings, and enol groups. Examples of such groups are triethanolamino, triphenylamino, thiourea, imidazole, oxazole, thiazole, acetylacetonyl, N-phenylglycine and ascorbic acid groups. Polymerizable compounds having primary, secondary and in particular tertiary amino groups are preferred.

Examples of compounds having photooxidizable groups are acrylic and alkacrylic esters of the formula I

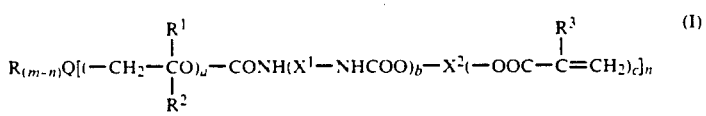

where
Q is

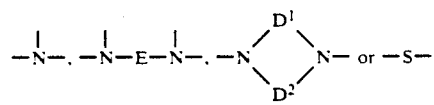

R is an alkyl, hydroxyalkyl or aryl group, $R^1$ and $R^2$ are each a hydrogen atom, an alkyl group or an alkoxyalkyl group, $R^3$ is a hydrogen atom or a methyl or ethyl group, $X^1$ is a saturated hydrocarbon group of 2 to 12 carbon atoms, $X^2$ is a (c+1)-valent saturated hydrocarbon group in which up to 5 methylene groups may have been replaced by oxygen atoms, $D^1$ and $D^2$ are each a saturated hydrocarbon group of 1 to 5 carbon atoms, E is a saturated hydrocarbon group of 2 to 12 carbon atoms, a cycloaliphatic group of 5 to 7 ring members, which may contain up to two N, O or S atoms as ring members, an arylene group of 6 to 12 carbon atoms or a heterocyclic aromatic group of 5 to 6 ring members, a is 0 or an integer from 1 to 4, b is 0 or 1, c is an integer from 1 to 3.

m is 2, 3 or 4, depending on the valence of Q, and n is an integer from 1 to m, where all the symbols of identical definition can be identical to or different from one another. If in the compound of the general formula I more than one radical R or more than one radical of the type indicated in square brackets is bonded to the central group Q, these radicals can be different from one another.

Compounds in which all the substituents of Q are polymerizable radicals, i.e., where m is n, are in general preferred. In general, not more than one radical a is 0; preferably a is 1.

An alkyl or hydroxyalkyl group R generally has 2 to 8, preferably 2 to 4, carbon atoms. An aryl radical R can in general be mononuclear or binuclear, preferably mononuclear, and may be substituted by alkyl or alkoxy groups of up to 5 carbon atoms or halogen atoms.

Alkyl and alkoxyalkyl groups $R^1$ and $R^2$ can contain 1 to 5 carbon atoms.

$R^3$ is preferably a hydrogen atom or a methyl group, in particular a methyl group.

$X^1$ is preferably a straight-chain or branched aliphatic or cycloaliphatic radical of preferably 4 to 10 carbon atoms.

$X^2$ preferably has 2 to 15 carbon atoms, of which up to 5 may have been replaced by oxygen atoms. In the case of pure carbon chains, generally those having 2 to 12, preferably 2 to 6, carbon atoms are used. $X^2$ can also be a cycloaliphatic group of 5 to 10 carbon atoms, in particular a cyclohexylene group.

$D^1$ and $D^2$ can be identical or different, and together with the two nitrogen atoms form a saturated heterocyclic ring of 5 to 10, preferably 6, ring members.

An alkylene group E preferably has 2 to 6 carbon atoms, and an arylene group E is preferably a phenylene group. Preferred cycloaliphatic groups are cyclohexylene groups and preferred aromatic heterocycles are those having N or S as heteroatoms and 5 to 6 ring members.

The value of c is preferably 1.

The polymerizable compounds of the formula I containing two urethane groups in every radical (b=1) are prepared by reacting acrylic or alkylacrylic acid esters containing free hydroxyl groups in a conventional manner with the same molar amount of diisocyanates and reacting the excess isocyanate group with hydroxyalkylamines, N,N-bishydroxyalkylpiperazines or N,N,N',N'-tetra-hydroxyalkylalkylenediamines, in each of which individual hydroxyalkyl groups may have been replaced by alkyl or aryl groups R. If a is 0, the result is a urea grouping.

Examples of the hydroxyalkylamine starting materials are triethanolamine, N-alkyl-N,N-di (hydroxyalkyl)amines, diethanolamine, tris(2-hydroxy-propyl)amine and tris(2-hydroxybutyl)amine.

Examples of diisocyanate starting materials are hexamethylene diisocyanate, 2,2,4-trimethyl-hexamethylene diisocyanate, 1,4-cyclohexylene diisocyanate and 1,1,3-trimethyl-3-isocyanatomethyl-5-isocyanatocyclohexane.

The hydroxy-group-containing esters used are, in particular, hydroxyethyl methacrylate and hydroxypropyl methacrylate (n or iso) and the corresponding acrylates.

The polymerizable compounds of the formula I where b is 0 are prepared by reacting the above-described hydroxyalkylamino compounds with isocyanato-containing acrylic or alkylacrylic acid esters. An isocyanato-containing ester used in particular is isocyanatoethyl (meth)acrylate.

Further suitable compounds having photooxidizable groups are compounds of the formula II

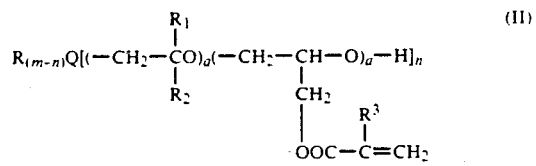

where Q, R, $R^1$, $R^2$, $R^3$, a, m and n are each as defined above and Q can additionally be a group

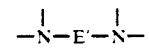

where E' is a group of the formula III

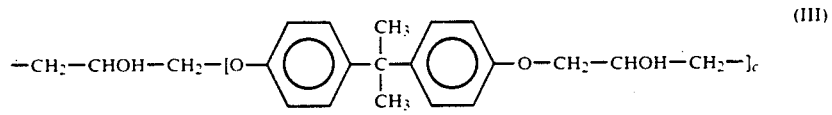

The compounds of the formula II are prepared similarly to those of the formula I, except that the hydroxyalkyl (alk)acrylates are replaced by the corresponding glycidyl (alk)acrylates.

Further suitable compounds having photooxidizable groups are acrylic and alkacrylic esters of the formula IV

where

Q'

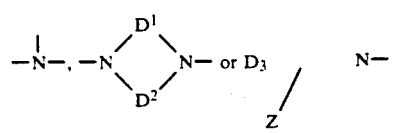

$X^{1'}$ is $C_iH_{2i}$ or

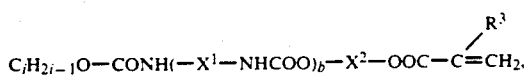

$D^3$ is a saturated hydrocarbon group of 4 to 8 carbon atoms which together with the nitrogen atom forms a 5- or 6-membered ring.

Z is a hydrogen atom or a radical of the formula

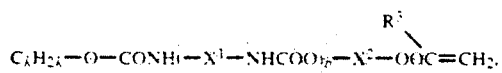

i and k are integers from 1 to 12, n' is 1, 2, or 3 depending on the valence of Q', and $R^3$, $X^1$, $X^2$, $D^1$, $D^2$, a and b are each as defined in formula I, where all the symbols of identical definition can be identical or different from one another and a is 0 in at least one substituent on the group Q'.

Of the compounds of the formula IV, those containing at least one urethane group as well as a urea group are preferred. Urea groups are for the purposes of the present invention groups of the formula

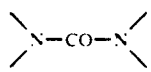

where the valences on the nitrogen are saturated by substituted or unsubstituted hydrocarbon radicals. However, it is also possible for one valence on one nitrogen atom to be bonded to a further carbonylamide group (CONH), producing a biuret structure.

The symbol a in the formula IV is preferably 0 or 1; i is preferably a number from 2 to 10.

The polymerizable compounds of the formula IV are prepared in the same way as compounds of the formula I.

In addition to the polymerizable compounds possessing photooxidizable groups, minor amounts of conventionally used monomers can be employed.

Examples are acrylic and methacrylic acid esters of dihydric or polyhydric alcohols, such as ethylene glycol diacrylate, polyethylene glycol dimethacrylate, acrylates and methacrylates of trimethylolethane, trimethylolopropane, pentaerythritol and dipentaerythritol and of polyhydric alicyclic alcohols or N-substituted acrylamides and methacrylamides. It is also advantageous to use reaction products of monoisocyanates or diisocyanates with partial esters of polyhydric alcohols. Such monomers are described in DE-A-2,064,079, DE-A-2,361,041 and DE-A-2,822,190.

The proportion of photopolymerizable compounds in the photopolymerizable mixture is in general about 10 to 75, preferably about 20 to 60, % by weight, based on the nonvolatile constituents.

Examples of suitable binders (a) are chlorinated polyethylene, chlorinated polypropylene, poly[alkyl(meth)acrylates] where the alkyl group is for example, methyl, ethyl, n-butyl, i-butyl, n-hexyl or 2-ethylhexyl, copolymers of said alkyl (meth)acrylates with at least one monomer, such as acrylonitrile, vinyl chloride, vinylidene chloride, styrene or butadiene; polyvinyl chloride, vinyl chloride/acrylonitrile copolymers, polyvinylidene chloride, vinylidene chloride/acrylonitrile copolymers, polyvinyl acetate, polyvinyl alcohol, polyacrylonitrile, acrylonitrile/styrene copolymers, acrylonitrile/butadiene/styrene copolymers, polystyrene, polymethylstyrene, polyamides (for example, nylon-6), polyurethanes, methylcellulose, ethylcellulose, acetylcellulose, polyvinylformal nd polyvinyl butyral.

Of particular suitability are binders that are insoluble in water, soluble in organic solvents and soluble or at least swellable in aqueous-alkaline solutions.

A special mention should be made of carboxyl-containing binders, for example, copolymers of (meth)acrylic acid and/or unsaturated homologs thereof, such as crotonic acid, copolymers of maleic anhydride or monoesters thereof, reaction products of hydroxyl-containing polymers with dicarboxylic anhydrides, and mixtures thereof.

It is also possible to use reaction products of polymers carrying acidic hydrogen atoms which have been wholly or partly reacted with activated isocyanates, for example, reaction products of hydroxyl-containing polymers with aliphatic or aromatic sulfonyl isocyanates or phosphinic acid isocyanates.

Also suitable are hydroxyl-containing polymers, for example, copolymers of hydroxy alkyl (meth)acrylates, copolymers of allyl alcohol, copolymers of vinyl alcohol, polyurethanes or polyesters, and also epoxy resins, provided they carry a sufficient number of free OH groups, or have been modified in such a way that they are soluble in aqueous-alkaline solutions, or those polymers carrying aromatically-bonded hydroxyl groups, for example, condensation products of condensable carbonyl compounds, in particular, formaldehyde, acetaldehyde or acetone, with phenols or copolymers of hydroxystyrenes. Finally, it is also possible to use copolymers of (meth)acrylamide with alkyl (meth)acrylates.

The above-described polymers are suitable in particular when they have a molecular weight between about 500 and 200,000 or higher, preferably of about 1,000 to 100,000, and either acid numbers between about 10 and 250, preferably about 20 and 200 or hydroxyl numbers between about 50 and 750, preferably about 100 and 500.

Preferred alkali-soluble binders include copolymers of (meth)acrylic acid with alkyl (meth)acrylates, (meth)acrylonitrile or the like, copolymers of crotonic acid with alkyl (meth)acrylates, (meth)acrylonitrile or the like, copolymers of vinylacetic acid with alkyl (meth)acrylates, copolymers of maleic anhydride with substituted or unsubstituted styrenes, unsaturated hydrocarbons, unsaturated ethers or esters, esterification products of copolymers of maleic anhydride, esterification products of hydroxyl-containing polymers with anhydrides of di- or polycarboxylic acids, copolymers of hydroxyalkyl (meth)acrylates with alkyl(meth)acrylates, (meth)acrylonitrile or the like, copolymers of allyl alcohol with substituted or unsubstituted styrenes, copolymers of vinyl alcohol with alkyl (meth)acrylates or other polymerizable unsaturated compounds, polyurethanes, provided they have a sufficient number of free OH groups, epoxy resins, polyesters, partially hydrolyzed vinyl acetate copolymers, polyvinyl acetals having free OH groups, epoxy resins, polyesters, partially hydrolyzed vinyl acetate copolymers, polyvinyl acetals having free OH groups, copolymers of hydroxystyrenes with alkyl (meth)acrylates or the like, phenol-formaldehyde resins, for example novolaks.

The amount of binder in the light-sensitive layer is, in general, about 20 to 85, preferably about 40 to 75, % by weight.

The photoinitiators (c) used can be a large number of substances. Examples are those derived from the basic skeleton of benzophenones, acetophenones, benzoins, benzils, benzil monoketals, fluorenone, thioxanthone, polynuclear quinones, acridines and quinazolines, and also trichloromethyl-s-triazines, 2-halomethyl-5-vinyl-1,3,4-oxadiazole derivatives, trichloromethyl-substituted halooxazoles or trihalomethyl-containing carbonylmethylene heterocycles as described in DE-A-3,333,450.

Preferred photoinitiators are photoreducible dyes, in particular, if combined with radiation-cleavable trihalomethyl compounds and perhaps with acridine, phenazine or quinoxaline photoinitiator compounds.

Suitable photoreducible dyes are, in particular, xanthene, benzoxanthene, benzothio-xanthene, thiazine, pyronine, porphyrine and acridine dyes. The amount of dye is, in general, between about 0.01 and 10, preferably between about 0.05 and 4, % by weight, based on the nonvolatile constituents of the layer.

To increase the photosensitivity, layers may include compounds having photolytically-cleavable trihalomethyl groups which are known per se for use as free-radical-forming photoinitiators for photopolymerizable mixtures. Proven coinitiators of this type are, in particular, compounds containing chlorine and bromine, in particular, chlorine, as halogens. The trihalomethyl groups can be bonded directly or via a fully conjugated chain to an aromatic carbocyclic or heterocyclic ring. Preference is given to compounds having a triazine ring in the basic skeleton which preferably carries two trihalomethyl groups, in particular, to those described in EP-A-137,452, DE-A-2,718,259 and DE-A-2,243,621. It is also possible to use coinitiators which themselves show little if any absorption in the spectral region of the copying light, such as trihalomethyltriazines containing substituents having comparatively short mesmerization-capable electron systems or aliphatic substituents. It is also possible to use compounds having a different basic structure that absorb in the shorter-wave UV region, for example, phenyl trihalomethyl sulfones or phenyl trihalomethyl ketones, for example, phenyl tribromomethyl sulfone.

These components are in general used in an amount of about 0.01 to 10, preferably about 0.05 to 6, % by weight, based on the nonvolatile constituents of the layer.

The materials according to the invention preferably contain as a further initiator constituent an acridine, phenazine or quinoxaline compound. These compounds are known for use as photoinitiators and are described in DE-C-2,027,467 and DE-C-2,039,861. The amount of this component is likewise within the range from about 0.01 to 10, preferably between about 0.05 and 5, % by weight.

If a further increase in the sensitivity in the visible region of the spectrum is desired, it can be brought about by adding a compound of the dibenzalacetone or coumarine type. This addition gives a more highly resolved copy and complete sensitization of the mixture to the visible region of the spectrum up to wavelengths of about 600 nm. The amount of this compound is likewise within the range from about 0.01 to 10, preferably from about 0.05 to 4, % by weight.

The total amount to polymerization initiators is in general about 0.05 to 20, preferably about 0.1 to 10, % by weight.

The photopolymerizable layers may contain various substances as additives, depending on the intended use and the desired properties. Examples include inhibitors for preventing thermal polymerization of the monomers, hydrogen donors, dyes, colored and uncolored pigments, color formers, indicato, plasticizers and chain transfer agents.

The optical density of the photopolymerizable mixtures is appropriately adjusted by means of suitable light-absorbing substances (d). These include dyes, pigments, UV absorbers and UV dyes, by which the layers into which they are incorporated are rendered impermeable to UV light. They are usually present in an amount of about 5 to 40, preferably about 10 to 30, % by weight.

Examples of UV absorbers and UV dyes which are added to the described photopolymerizable mixtures include 2,2'-dihydroxy-4-methoxy-benzophenone, 4-dodecyloxy-2-hydroxy-benzophenone, 2,4-dihydroxybenzophenone, hydroxyphenyl-benzotriazole, resorcinol monobenzoate, Oil Orange (C.I. 12055), Sudan Orange RA (C.I. 12055), Caprayl Orange (C.I. Acid Orange 60), Sudan Yellow (C.I. Solvent Yellow 30), Sirius Light Yellow R extra (C.I. 29025), Remazole Brilliant Orange RR (C.I. 17756), Remazole Brilliant Orange 3R (C.I. 17757), Remazole Gold Yellow G (C.I. 18852), Remazol Yellow RTL (Reactive Yellow 24), Fast Light Yellow 3G (C.I. 19120), Astrazon Yellow 3G (C.I. 48055), Astrazon Yellow 5G (C.I. 48065) or Basic Yellow 52115 (C.I. 48060), and also the not yet classified dyes Astrazon Orange 3R, Astrazon Yellow 7 GLL, Astrazon Yellow GRL and Astra Yellow R. Astrazon Orange R (C.I. 48040) and Astrazon Orange G (C.I. 48035) have found to be particularly suitable. It is also possible to use pigment dyes or pigment preparations, such as Permanent Red FGR (C.I. 12370), Permanent Carmine FBB (C.I. 12485), Hostaperm Blue B2G (C.I. 74160), and Renol Black G (C.I. 30235). The optical density can also be appropriately adjusted with the aid of suitable discolorants which originally are colorless. They are dyed by the action of the photodecomposition products of the free-radical-producing component. Arylamines may be mentioned as typical examples. Suitable representatives for the purposes of this invention not only include simple arylamines, such as primary, secondary or tertiary aromatic amines, but also leuco dyes. Examples of compounds that have proven useful for practical applications include diphenyl amine, dibenzyl aniline, triphenyl amine, diethylaniline, diphenyl-p-phenylene diamine, p-toluidine, leucomalachite green, leucocrystal violet, 4,4'-bis-dimethylamino-diphenylmethyl imine and 4,4',4"-trisdipropylamino-triphenyl methane. Further well-suited compounds include, for example, oxadiazole derivatives according to DE-A-10 58 836, 6-phenyl-α-pyrones (DE-A-16 68 358), 4,4'-dibenzal-acetones, such as 4-diethylamino-4,-methoxydibenzal acetone, and coumarine derivatives, such as 3-acetyl-7-diethylamino coumarine.

It is generally favorable to keep the mixtures away from the influence of atmospheric oxygen during the photopolymerization. When the mixture is used in the form of thin copying layers, it is advisable to apply a suitable protective film impermeable to oxygen. This can be self-supporting and peeled-off before development of the copying layer. For this purpose, polyester films, for example, are suitable. The protective film can also comprise a material that dissolves in the developer liquid or that can at least be removed during development from the non-hardened areas. Materials suitable for this purpose are, for example, waxes, polyvinyl alcohol, polyphosphates, sugars, etc. Such protective layers generally have a thickness of about 0.1 to 10 μm, preferably of about 1 to 5 μm.

Suitable layer supports for recording materials produced using the mixture according to the invention are, for example, aluminum, steel, zinc, copper and plastic films, for example, made from polyethylene terephthalate or cellulose acetate, and also transparent papers or glass plates. Preferred transparent layer supports are biaxially-oriented polyester films, particularly polyethylene terephthalate films, which preferably are of glass-clear photographic quality and usually have a thickness of about 25 to 250 μm. The photopolymerizable layers, which generally are about 0.5 to 10 μm thick, adhere well to these films even without an adhesion-promoting treatment, and the adhesion is not impaired by development. If desired, the adhesion of the photosensitive layer can be further improved by applying a single- or double-sided adhesion-promoting coating onto the support. Terpolymers of vinylidene chloride, acrylic esters and itaconic acid are suited for this purpose (U.S. Pat. No. 2,627,088 and 2,698-240). The heat-set acrylate or methacrylate coatings according to U.S. Pat. No. 3,819,773 are also suited as adhesion promoters. These are applied to polyester film from an aqueous medium and improve the adhesion of reprographic layers applied thereon from organic solvents. It is also possible to apply an adhesion-promoting coating comprising cross-linked vinyl acetate polymers according to EP-A-0,146,066.

The process of this invention comprises various embodiments for differing purposes and fields of application. When the photopolymerizable mixture of the invention is applied as a sole photosensitive layer to a transparent layer support, the resulting material can be used as a duplicating film or can be imaged by means of laser irradiation and is then suitable for recording information or as a mask for contact-exposure of conventional, UV-sensitive recording materials.

Another embodiment comprises the production of customary reprographic materials such as printing plates or photoresist materials, both on transparent and non-transparent supports. Herein, the photopolymerizable mixture is applied directly onto a UV-sensitive, positive-working or negative-working layer, without mutual mixing of the layers, which can be achieved either by using different binders and solvents or by preparation of the photopolymer layer on a separate, temporary support and subsequent lamination. After imagewise exposure the unexposed layer areas are removed by development, and the remaining, UV-impermeable, hardened image areas then serve as an image stencil in a second exposure, with UV light, of the UV-sensitive positive-working or negative-working layer. By appropriately combining the layers, it is possible to protect the layer below the hardened image areas effectively against development, so that a well-developed image can be produced in a single developing step.

Yet another process variant is preferably employed for producing color proofing films that can be imaged by laser irradiation. In this embodiment the photopolymerizable mixture is applied to the uncoated surface of negative-working or positive-working color proofing films, such as are described, for example, in EP-A-0,182,031 and EP-A-0,179,274, in the four basic colors cyan, yellow, magenta and black, for producing image stencils. The UV-sensitive layer, to which an adhesive layer is applied, is laminated onto a receiving sheet. Following imagewise exposure of the photopolymerizable layer, which is sensitive in the visible spectral region and which in the layer composite forms the uppermost layer, and a subsequent development step, an image stencil is obtained having an optical density towards UV-radiation that is sufficiently high. The second, UV-sensitive layer is now differentiated in imagewise configuration by exposure without an original, the temporary support film is peeled-off, and the underlying, positive-working or negative-working layer is developed. The adhesive layer is not attacked by development. This process exhibits the advantage that the high-speed UV-absorbing layer is peeled-off after the second exposure and thus the color shade of the ready color image is preserved without alteration. When the individual images having the colors yellow, cyan, magenta and black, respectively, are laminated above one another a four color image is obtained that is a true reproduction of the original from which the color separations were prepared.

The usable photosensitivity of the materials according to this invention is about 450 to 800 nm, particularly about 450 to 650 nm, and thus covers a very wide range. Therefore, a great number of various light sources can be employed. Both point sources and light sources irradiating larger areas are suitable. Examples include carbon arc lamps, xenon arc lamps, mercury vapor lamps which may be doped with metal halides, fluorescent lamps comprising luminous substances which emit UV radiation, argon glow lamps, electron flash lamps, photographic floodlight lamps and tungsten-quartz-iodine lamps. Laser light sources are particularly well suited, e.g., argon ion or krypton ion lasers having strong emissions (Ar laser) at 457 nm, 476 nm, 488 nm, 514 nm, 528 nm. With this kind of imagewise exposure, no image stencil in contact with the photopolymer layer is required; the controlled laser beam creates the pattern directly on the layer. In this context, the high sensitivity of the materials according to this invention is of great advantage.

Employing the process of this invention, many different types of copying masters exhibiting a strong image contrast in the near UV region, i.e., at wavelengths of less than about 450 nm, can be produced. By applying layers comprising the mixture according to the invention onto known reprographic materials, the energy required for the imagewise exposure can be substantially reduced. By an imagewise exposure, with visible light, of the high-speed photopolymerizable layers of the invention, exposure stencils of good coverage are obtained in situ for the less sensitive layer. The latter can be exposed relatively fast and simply by irradiation with UV light, without an additional master. Where desired, the UV-absorbing exposure stencil can be removed subsequently, for example, by peeling it off together with its support film as described above in connection with the color proofing method, or by dissolving it away with the aid of an appropriate selective solvent or during development of an underlying negative layer, together with the unexposed, covered layer areas thereof.

The exposed photopolymerizable layers of this invention are processed in a conventional manner. To effect better crosslinking in the layers, it is possible to heat after exposure. For development, they are treated with a suitable developer solution, for example, with organic solvents, but preferably with a weakly alkaline aqueous solution, which serves to remove the unexposed areas of the layer, leaving behind the exposed areas of the copying layer on the base material. The developer solutions may contain a small amount, preferably less than about 5% by weight, of water-miscible organic solvents. They may further contain wetting agents, dyes, salts and other additives.

In what follows, the invention is described with reference to illustrative embodiments. Parts by weight (p.b.w.) bear the same relation to parts by volume (p.b.v.) as the g to the cm³. Percentages and proportional ratios are by weight, unless otherwise stated.

EXAMPLE 1

The support materials used are 35 μm thick sheets of polyethylene terephthalate film. They are coated with a solution of the following composition:

| | | |
|---|---|---|
| 2.87 | p.b.w. | of a 34.8% strength solution of a terpolymer of styrene, n-hexyl methacrylate and methacrylic acid (10:60:30) of acid number 190, in butanone. |
| 4.50 | p.b.w. | of a 31% strength solution of the reaction product of 1 mole of triethanolamine with 3 moles of isocyanatoethyl methacrylate in butanone. |
| 0.04 | p.b.w. | of Eosin alcohol-soluble (C.I. 45386). |
| 0.03 | p.b.w. | of 2,4-bis-trichloromethyl-6-(4-styrylphenyl)-s-triazine. |
| 0.06 | p.b.w. | of 9-phenylacridine, and |
| 0.20 | p.b.w. | of 2,5-bis-(4-diethylaminophenyl)-1,3,4-oxadiazole, and |
| 0.20 | p.b.w. | of 4-dimethylamino-4'-methoxy-dibenzalacetone, in |
| 22.00 | p.b.w. | of propylene glycol monomethyl ether. |

The resulting solution is applied by spinning in such a way that different dry layer weights of 2.0 to 3.2 g/m² are obtained. The coated films are then dried at 100° C. in an air-circulation cabinet for two minutes. They are then coated with a 15% strength aqueous solution of polyvinyl alcohol (12% of residual acetyl groups, K value 4). Drying leaves cover layers having a weight of about 2.5 g/m². The films obtained are irradiated with a 5 kW metal halide lamp at a distance of 110 cm under a 13-step exposure wedge with density increments of 0.15 onto which, as fare as indicated, in addition a silver film of uniform blacking (density 1.57) and uniform absorption across the entire spectrum is mounted as a gray filter. To test the sensitivity of the films in visible light, 3 μmm thick cut-off filters from Schott having the cut-off transmissibilities indicated in the table below are mounted on the irradiation wedge. Following an irradiation period of 40 seconds, the films are heated to 100° C. for one minute. Thereafter, they are developed for 1 minute in a circulating developer bath of the following composition, wiped slightly and rinsed with water:

| | | |
|---|---|---|
| 8.5 | p.b.w. | of sodium metasilicate.9 H₂O, |
| 0.8 | p.b.w. | of NaOH and |
| 1.5 | p.b.w. | of Na₂B₄O₇ × H₂O, in |
| 89.2 | p.b.w. | of fully demineralized water. |

TABLE 1

| Layer Weight | Gray Filter | Cut-off Filter | Wedge Steps | Optical Density |
|---|---|---|---|---|
| 2.0 g/m² | yes | — | 6 | 2.3 |
| | no | 455 | 7 | |
| 2.5 g/m² | yes | — | 5 | 2.8 |

TABLE 1-continued

| Layer Weight | Gray Filter | Cut-off Filter | Wedge Steps | Optical Density |
|---|---|---|---|---|
| | no | 455 | 6 | |
| 3.2 g/m² | yes | — | 5 | 3.4 |
| | no | 455 | 6 | |

The optical densities are determined with the aid of a photovolt densitometer at 395 nm. The resulting positive proofs can be used as photographic masters for the exposure of customary, commercially available, presensitized positive-working or negative-working printing plates, in lieu of a corresponding silver film master. Under customary exposure conditions, clean images of the master are obtained on the printing plate.

EXAMPLE 2 (COMPARATIVE EXAMPLE)

The support material of Example is spin-coated with a solution of the following composition, such that a dry layer weight of 2.5 g/m² is obtained:

| | | |
|---|---|---|
| 2.87 | p.b.w. | of the terpolymer solution of Example 1. |
| 0.70 | p.b.w. | of trimethylolpropane triacrylate. |
| 0.04 | p.b.w. | of Eosine |
| 0.03 | p.b.w. | of the s-triazine of Example 1. |
| 0.06 | p.b.w. | of 9-phenylacridine. |
| 0.20 | p.b.w. | of the oxadiazole of Example 1, and |
| 0.20 | p.b.w. | of the dibenzalacetone of Example 1, in |
| 20.00 | p.b.w. | propylene glycol monomethyl ether. |

The film is processed as described in Example 1. The following numbers of fully crosslinked wedge steps are obtained after an exposure time of 40 seconds:

| Gray Filter | Cut-off Filter | Wedge Steps |
|---|---|---|
| yes | — | 3 |
| no | 455 nm | 2 |

EXAMPLE 3

A biaxially-oriented 75 μm thick polyethylene terephthalate film provided with an adhesion-promoting coating is spin-coated with the coating solution of Example 1 such that a dry layer weight of 2.5 g/m² is obtained. The film is processed as described in Example 1. After an exposure time of 40 seconds, 7 crosslinked wedge steps are obtained under the gray filter and 8 wedge steps are obtained under the 455 nm cut-off filter.

EXAMPLE 4

A biaxially-oriented, 35 μm thick polyethylene terephthalate film is spin-coated with the coating solution of Example 1, such that a dry layer weight of 3 g/m² results. Then the layer is laminated, at 115° C. and an advance speed of 1.5 μm/min, onto a commercially available presensitized positive-working printing plate containing a 1,2-naphthoquinonediazide sulfonic acid ester as the photosensitive substance. As described in Example 1, the plate is exposed through a negative master and the silver film specified in Example 1. The plate is baked for 1 minute at 100° C., then the cover film is peeled-off. The hardened image portions of the photopolymerizable layer remain on the plate as a UV-impermeable, positive image mask, whereas the unexposed portions adhere to the cover film. A subsequently performed UV exposure for 30 seconds without master, followed by removal of the soluble portions of the quinonediazide layer with an aqueous-alkaline solution, results in a printing plate which is positive, relative to the original. 150,000 good prints are obtained. The peeled-off film can be used as a positive master.

EXAMPLE 5

The layer support material of Example 1 is spin-coated with a solution of the following composition, such that a dry layer weight of 2 g/m² results:

| | | |
|---|---|---|
| 2.87 | p.b.w. | of the terpolymer solution of Example 1. |
| 4.50 | p.b.w. | of the monomer solution of Example 1, |
| 0.05 | p.b.w | of the s-triazine of Example 1, |
| 0.05 | p.b.w. | of 9-phenylacridine, |
| 0.04 | p.b.w. | of Eosine |
| 0.40 | p.b.w. | of the oxadiazole of Example 1, |
| 0.30 | p.b.w. | of the dibenzalacetone of Example 1, and |
| 0.20 | p.b.w. | of tris-(4-dimethylaminophenyl)-methane, in |
| 20.00 | p.b.w. | of propylene glycol monomethyl ether. |

The coated film is dried and provided with a cover layer, as described in Example 1. Exposure for 30 seconds and development as in Example 1 results in 3 fully-crosslinked wedge steps using a gray filter and in 5 fully-crosslinked wedge steps using a cut-off filter.

By exposing the material for 10 seconds without a master, employing a 5 kW metal halide lamp, the color is intensified. The extinction curve shows a density of at least 3.2 in the spectral region from 300 to 550 nm. Customary negative-working planographic printing plates coated with diazo layers and a customary photopolymer planographic plate are exposed through a master prepared as described above. The resulting printing forms are free from scum and do not show any signs of toning in the printing press.

EXAMPLE 6

Four photosensitive coating solutions having the basic colors cyan, yellow, magenta and black and being composed (p.b.w.) as specified below are prepared:

| Constituents | Cyan | Yellow | Magenta | Black |
|---|---|---|---|---|
| 2-Methoxy-ethanol | 41.00 | 41.00 | 46.50 | 41.00 |
| Butanone | 41.00 | 40.99 | 46.48 | 41.00 |
| Butyrolactone | 10.00 | 10.00 | — | 10.00 |
| Dimethyl phthalate | 0.75 | 0.75 | 0.88 | 0.75 |
| Dibutyl phthalate | 0.25 | 0.25 | — | 0.25 |
| p-Toluenesulfonic acid | — | — | 0.18 | 0.35 |
| Scripset 540[1] | 0.33 | 2.60 | 3.15 | 3.71 |
| Scripset 550[2] | 1.17 | — | — | — |
| hydrolyzed Scripset 540 | — | — | 0.67 | — |
| SMA 2625[3] | — | 2.02 | — | — |
| Diazonium salt polycondensation product[4] | 1.33 | 1.35 | 0.70 | 2.00 |
| Phthalocyanine blue | 1.17 | — | — | — |
| Yellow pigment | — | 1.04 | — | — |
| Magenta pigment | — | — | 1.44 | — |
| Black pigment | — | — | — | 0.94 |
| optical density | 1.1 | 0.9 | 1.2 | 1.5 |

[1] Styrene/monoisobutyl maleate copolymer; acid number 400
[2] Styrene/monoisobutyl maleate copolymer; molecular weight 45000, acid number 175
[3] Styrene/maleic anhydride copolymer; molecular weight 1900, acid number 220
[4] prepared from 1 mole 3-methoxy-diphenylamine-4-diazonium salt and 1 mole of 4,4′-bis-methoxymethyl-diphenyl ether, precipitated as mesitylene sulfonate The color pigments are added to the individual solutions in the form of dispersions comprised of butanone, Scripset 540 and the respective pigment. The individual solutions are coated onto separate temporary supports comprised of 75 μm thick polyester film (Melinex 516) and dried, such that the required optical density values are achieved. The layer weights are about 1.3 g/m² for cyan, about 0.9 g/m² for yellow, about 1.8 g/m² for magenta and about 1.2 g/m² for black. An adhesive solution comprised of 78 pbw of n-butyl acetate, 1 pbw of Resoflex R-296 (polymeric plasticizer) and 21 p.b.w. of Mowilith 25 (polyvinyl acetate, molecular weight 100,000) is applied onto the photosensitive layer and dried, so that an adhesive coating having a dry weight of 12 g/m² is obtained. The rear surfaces of the polyester films are coated with the photosensitive composition of Example 1, the resulting dry layer weights being 3 g/m² The photopolymer layer is provided with a cover layer of polyvinyl alcohol, thereafter the adhesive coating of the yellow material is laminated at 80° C. to a 180 μm thick polyester receiving sheet (Melinex 3020). The photopolymerizable layer is then digitally exposed according to the yellow image portions, using laser light of wavelengths 488 nm or 514 nm or is exposed by contact exposure through a color separation corresponding to the yellow image portions. The exposed material is baked for 1 minute at 100° C. and then developed for 60 seconds in a circulating bath, using the developer of Example 1.

The non-exposed areas are dissolved away, and a UV light absorbing photomask for the underlying photosensitive diazo layer results. A negative image of the superposed image stencil is produced by subsequent exposure without an original, with light emitting in the spectral region below 450 nm. The temporary support is peeled-off, and the receiving sheet with the exposed yellow layer is immersed for 15 seconds in the following developer having a temperature of 27° C.:

| | |
|---|---|
| 89.264 | p.b.w. of water |
| 0.269 | p.b.w. of monosodium phosphate, |
| 2.230 | p.b.w. of trisodium phosphate × 12 H₂O, and |
| 8.237 | p.b.w. of sodium tetradecylsulfate. |

The non-exposed yellow areas are dissolved away by development, the exposed areas remaining on the support sheet. The adhesive layer is not attacked by the two developers. Following this treatment step, the imaged material is rinsed and dried. In the same way, the films having the colors magenta, cyan and black are laminated onto the respective preceding single-color image in subsequent order and processed. Finally, a four-color image is obtained representing a true reproduction of the original used to prepare the color separations.

EXAMPLE 7

Four positive-working photosensitive solutions having the colors cyan, yellow, magenta and black and being composed (p.b.w.) as specified below are prepared:

| Constituents | cyan | yellow | magenta | black |
|---|---|---|---|---|
| Diacetone alcohol | — | 11.7 | — | — |
| Butanone | 35.52 | 34.45 | 24.23 | 38.62 |
| Butyrolactone | 22.60 | 11.15 | 24.04 | 5.74 |
| Propylene glycol mono- | 34.76 | 35.21 | 44.94 | 48.34 |

-continued

| Constituents | cyan | yellow | magenta | black |
|---|---|---|---|---|
| methyl ether | | | | |
| Scripset 540 | 1.60 | 2.01 | 2.15 | 2.39 |
| SMA 2625 | 1.74 | 1.17 | — | 0.60 |
| Polyvinyl butyral (glass trans. temp. 65° C. | 0.58 | 0.59 | 0.67 | 0.30 |
| Diazonium salt poly-condensation product as in Example 6 | 2.09 | 2.58 | 2.81 | 2.72 |
| Phthalocyanine blue | 1.11 | — | — | — |
| Yellow pigment | — | 1.08 | — | — |
| Magenta pigment | — | — | 1.15 | — |
| Black pigment | — | — | — | 1.29 |
| optical density | 1.2 | 1.0 | 1.4 | 1.6 |

The color pigments are added to the individual solutions in the form of dispersions comprised of butanone, Scripset 540 and the respective pigment. The individual solutions are coated onto separate temporary supports comprised of 75 μm thick polyester films (Melinex 516) and dried, such that the required optical density values are achieved. The layer weights are about 1.23 g/m² for cyan, about 1.4 g/m² for yellow, about 2.0 g/m² for magenta and about 1.0 g/m² for black. An adhesive solution comprised of 70 p.b.w. of isopropyl acetate and 30 p.b.w. of polyvinyl acetate (molecular weight 110,000) is applied onto the photosensitive layer and dried, so that an adhesive coating having a dry weight of 8 g/m² is obtained.

The rear surfaces of the polyester films are coated with the photosensitive composition of Example 1, the resulting dry layer weights being 3 g/m². The photopolymer layer is provided with a cover layer of polyvinyl alcohol, thereafter the adhesive coating of the yellow color proofing film is laminated at 80° C. to a 180 μm thick polyester receiving sheet (Melinex 3020). The photopolymerizable layer is then digitally exposed according to the yellow image portions, using laser light of wavelengths 488 nm or 514 nm or is exposed by contact exposure through the color separation corresponding to the yellow image portions. The exposed material is baked for 1 minute at 100° C. and then developed for 60 seconds in a circulating bath, using the developer of Example 1.

The non-exposed areas are dissolved away, and a UV light absorbing image stencil for the underlying photosensitive quinone diazide layer results. A positive image of the superposed image stencil is produced by subsequent exposure without an original, with light emitting in the spectral region below 450 nm. The temporary support is peeled-off, and the receiving sheet with the exposed yellow layer is immersed for 15 seconds in the developer specified in Example 6 having a temperature of 27° C.

The exposed yellow areas are dissolved away by development, the non-exposed areas remaining on the support sheet. The adhesive layer is not attacked by the two developers. Following this treatment step, the imaged material is rinsed and dried. In the same way, the films having the colors magenta, cyan and black are laminated onto the respective preceding single-color image in subsequent order and processed. After a final exposure without an original using light in the spectral region below 450 nm, a four-color image representing a reproduction of the original color impression is obtained.

What is claimed is:

1. A photopolymerizable mixture comprising, in admixture:
    (a) a polymeric binder,
    (b) a photopolymerizable acrylate or alkacrylate of a polyhydric alcohol possessing at least one photooxidizable group,
    (c) a compound or a combination of compounds, which under the action of light in the spectral region of 450 to 650 nm is capable of initiating the polymerization of compound (b), and
    (d) between about 10 and 30% by weight, of a combination of at least one dibenzal acetone and at least one oxadiazole derivative, which combination absorbs light in the region below 450 nm or that forms a compound that absorbs light in the region below 450 nm upon exposure in the mixture, whereby the optical density of the exposed mixture in this range is at least about 2.0 at a layer thickness of 2 μm.

2. A photopolymerizable mixture as claimed in claim 1, wherein the photooxidizable group is an amino, urea, thio or enol group.

3. A photopolymerizable mixture as claimed in claim 1, wherein compound (c) is a photoreducible dye.

4. A photopolymerizable mixture as claimed in claim 3, wherein the photoreducible dye is a xanthene, thiazine, pyronine, phorphyrine or acridine dye.

5. A photopolymerizable mixture as claimed in claim 3, comprising at least one compound (c) that forms free radicals upon exposure which are capable of initiating the polymerization of the acrylate or alkacrylate (b).

6. A photopolymerizable mixture as claimed in claim 1, wherein the binder is insoluble in water and soluble in aqueous-alkaline solutions.

7. A photopolymerizable mixture as claimed in claim 1, comprising about 20 to 85% by weight of binder (a), about 10 to 75% by weight of acrylate or alkacrylate (b) and about 0.05 to 20% by weight of photosensitive polymerization initiators (c).

8. A photopolymerizable recording material comprising a layer support and a photopolymerizable layer, wherein said photopolymerizable layer comprises a mixture as claimed in claim 1.

9. A recording material as claimed in claim 8, wherein the layer support is transparent.

10. A recording material as claimed in claim 9, further comprising an additional photosensitive layer applied to the rear surface of the layer support and sensitive to light in the spectral region below 450 nm.

11. A recording material as claimed in claim 10, wherein the additional photosensitive layer contains a dye or pigment having one of the basic colors of the multicolor print that can be transferred from the layer support to a receiving sheet.

12. A recording material as claimed in claim 8, wherein the layer support is impermeable to actinic light and wherein another layer is provided below the photopolymerizable layer on the support, said layer being sensitive to light in the spectral region below 450 nm and insoluble in the developer solution used for the photopolymerizable layer.

13. A recording material as claimed in claim 8, wherein the photopolymerizable layer is protected by a cover layer possessing low permeability to atmospheric oxygen.

14. A photopolymerizable mixture as claimed in claim 1, comprising about 40 to 75% by weight of binder (a), about 20 to 60% by weight of acrylate or alkacrylate (b), about 0.1 to 10% by weight of photosensitive polymerization initiators (c) and about 10 to 30% by weight of light-absorbing compound (d).

15. A photopolymerizable mixture as claimed in claim 1, consisting essentially of components (a), (b), (c) and (d).

* * * * *